(12) United States Patent
Toyama et al.

(10) Patent No.: US 12,026,026 B2
(45) Date of Patent: Jul. 2, 2024

(54) ELECTRONIC DEVICE AND INFORMATION PROCESSING UNIT

(71) Applicant: KYOCERA CORPORATION, Kyoto (JP)

(72) Inventors: Masatoshi Toyama, Yokohama (JP); Kouichi Ando, Yokohama (JP)

(73) Assignee: KYOCERA CORPORATION, Kyoto (JP)

( * ) Notice: Subject to any disclaimer, the term of this patent is extended or adjusted under 35 U.S.C. 154(b) by 235 days.

(21) Appl. No.: 17/590,818

(22) Filed: Feb. 2, 2022

(65) Prior Publication Data

US 2022/0253114 A1    Aug. 11, 2022

(30) Foreign Application Priority Data

Feb. 5, 2021   (JP) .................. 2021-017724

(51) Int. Cl.
*G06F 1/20*  (2006.01)
*H05K 5/00*  (2006.01)
*H05K 7/20*  (2006.01)
*H05K 9/00*  (2006.01)

(52) U.S. Cl.
CPC .......... *G06F 1/203* (2013.01); *H05K 5/0017* (2013.01); *H05K 7/20963* (2013.01); *H05K 9/0081* (2013.01)

(58) Field of Classification Search
CPC .............................. H05K 5/0017; G06F 1/203
See application file for complete search history.

(56) References Cited

U.S. PATENT DOCUMENTS

| 8,879,269 B2 * | 11/2014 | Hill ................. H05K 9/0032 361/818 |
| 9,639,120 B2 * | 5/2017 | Wu ................. G06F 1/203 |
| 2010/0072952 A1 | 3/2010 | Nakajima |
| 2018/0151855 A1 | 5/2018 | Iwasaki et al. |
| 2018/0162098 A1 | 6/2018 | Joo |

FOREIGN PATENT DOCUMENTS

| JP | 2001196034 A | 7/2001 |
| JP | 2008131512 A | 6/2008 |
| JP | 2014007059 A | 1/2014 |
| JP | 2017123212 A | 7/2017 |
| JP | 2018501633 A | 1/2018 |
| WO | 2017026145 A1 | 2/2017 |

\* cited by examiner

*Primary Examiner* — Mukundbhai G Patel
(74) *Attorney, Agent, or Firm* — HAUPTMAN HAM, LLP

(57) ABSTRACT

An electronic device includes a heat generating body including a first heat dissipation member on a first surface, a battery including a second heat dissipation member on a second surface, a third heat dissipation member in contact with a support body, and a fourth heat dissipation member. The fourth heat dissipation member is sandwiched between the first heat dissipation member and the third heat dissipation member in a state in which at least a portion of the fourth heat dissipation member is in contact with the first surface via the first heat dissipation member, and an other portion of the fourth heat dissipation member is in contact with the second surface of the battery via the second heat dissipation member.

7 Claims, 9 Drawing Sheets

ELECTRONIC DEVICE AND INFORMATION PROCESSING UNIT

CROSS-REFERENCE TO RELATED APPLICATION

The present application claims priority to and the benefit of Japanese Patent Application No. 2021-017724 filed Feb. 5, 2021, the entire contents of which are incorporated herein by reference.

TECHNICAL FIELD

The present application relates to an electronic device and an information processing unit.

BACKGROUND

Heat generation countermeasures have been taken for, for example, an electronic device incorporating a battery, a processor, and the like.

SUMMARY

In recent years, electronic devices have been desired to be lightweight and thin, and further improvement in heat generation countermeasures has been desired in order to perform information processing at high speed and large capacity.

DESCRIPTION OF EMBODIMENTS

Figure 1:
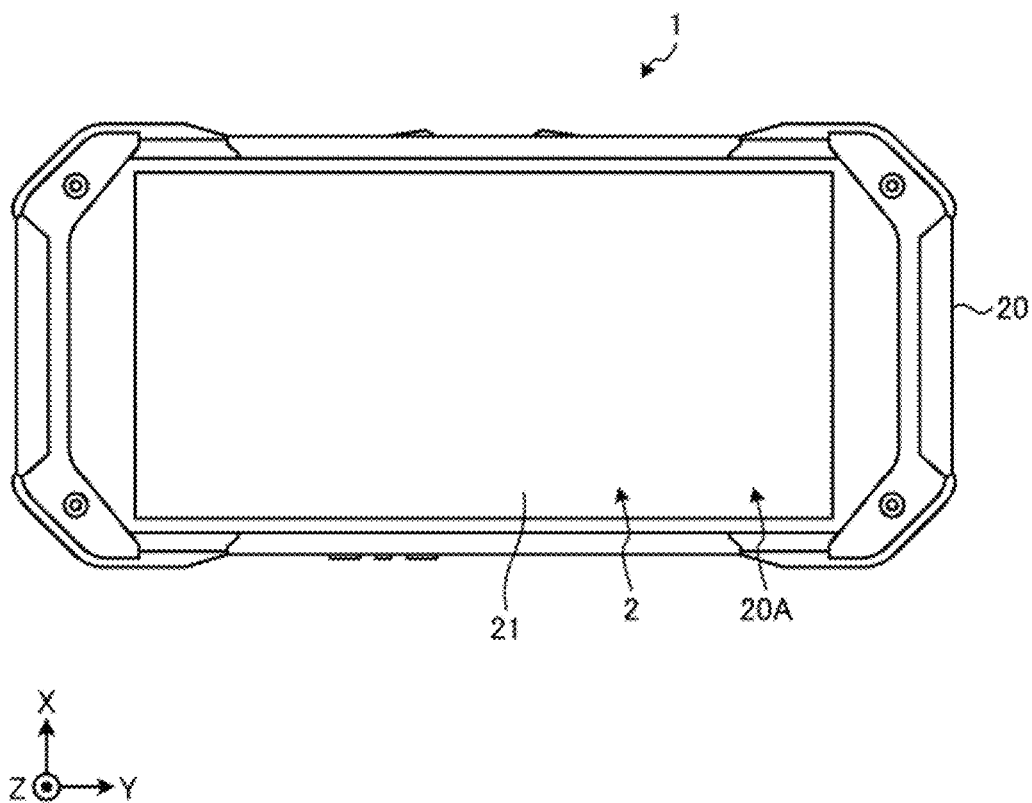
FIG. 1 is an external view of an electronic device according to one of embodiments.

A plurality of embodiments for implementing an electronic device, an information processing unit, and the like according to the present application will be described in detail with reference to the drawings. Note that the following description is not intended to limit the present invention. Components in the following description include elements that can be easily conceived by those skilled in the art, elements that are substantially the same, and elements in a so-called equivalent range. In the following description, like components may be denoted by the same reference numerals. Redundant descriptions may be omitted.

Figure 2:
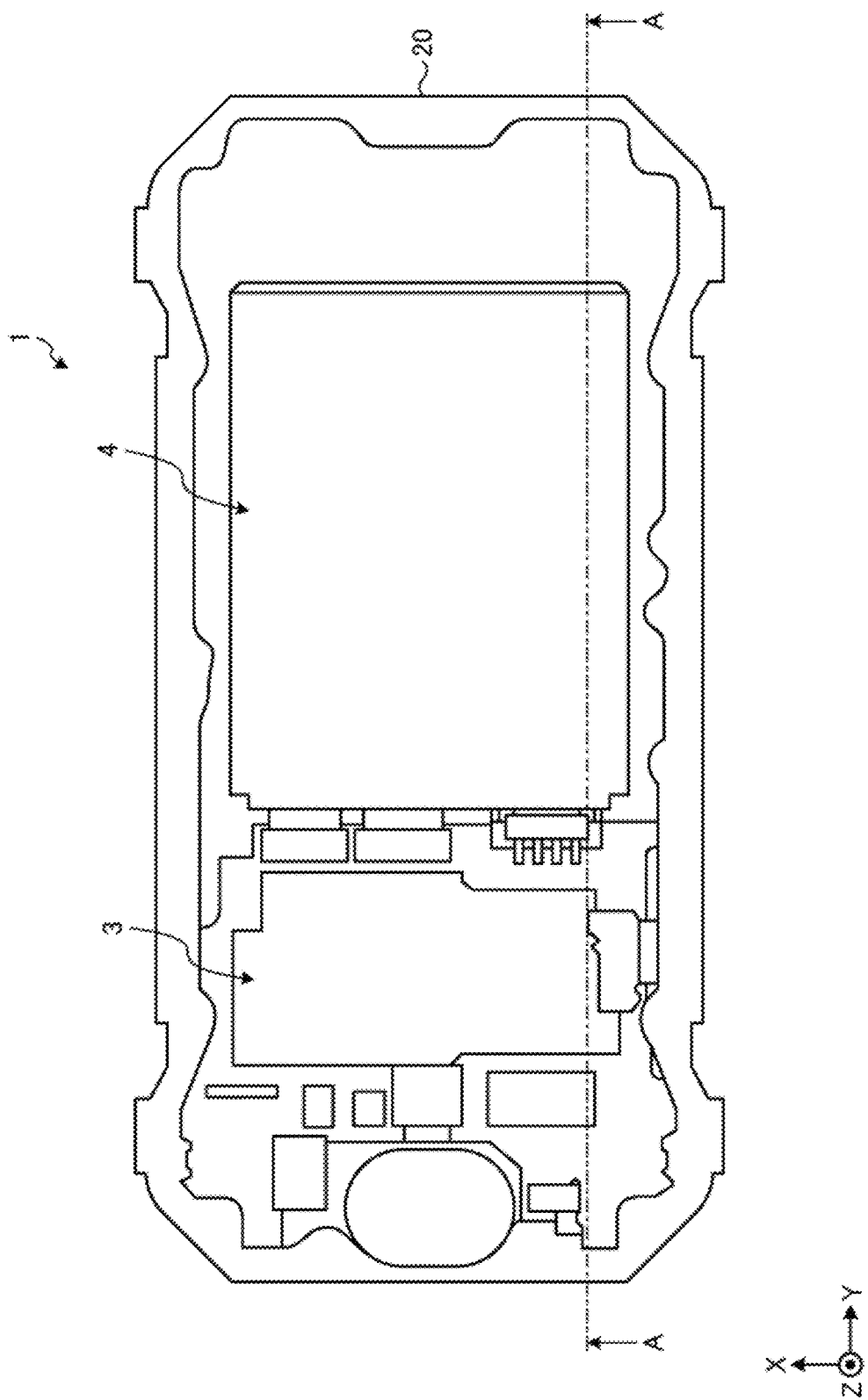
FIG. 2 is a diagram illustrating an interior structure of the electronic device illustrated in FIG. 1.
Figure 3:
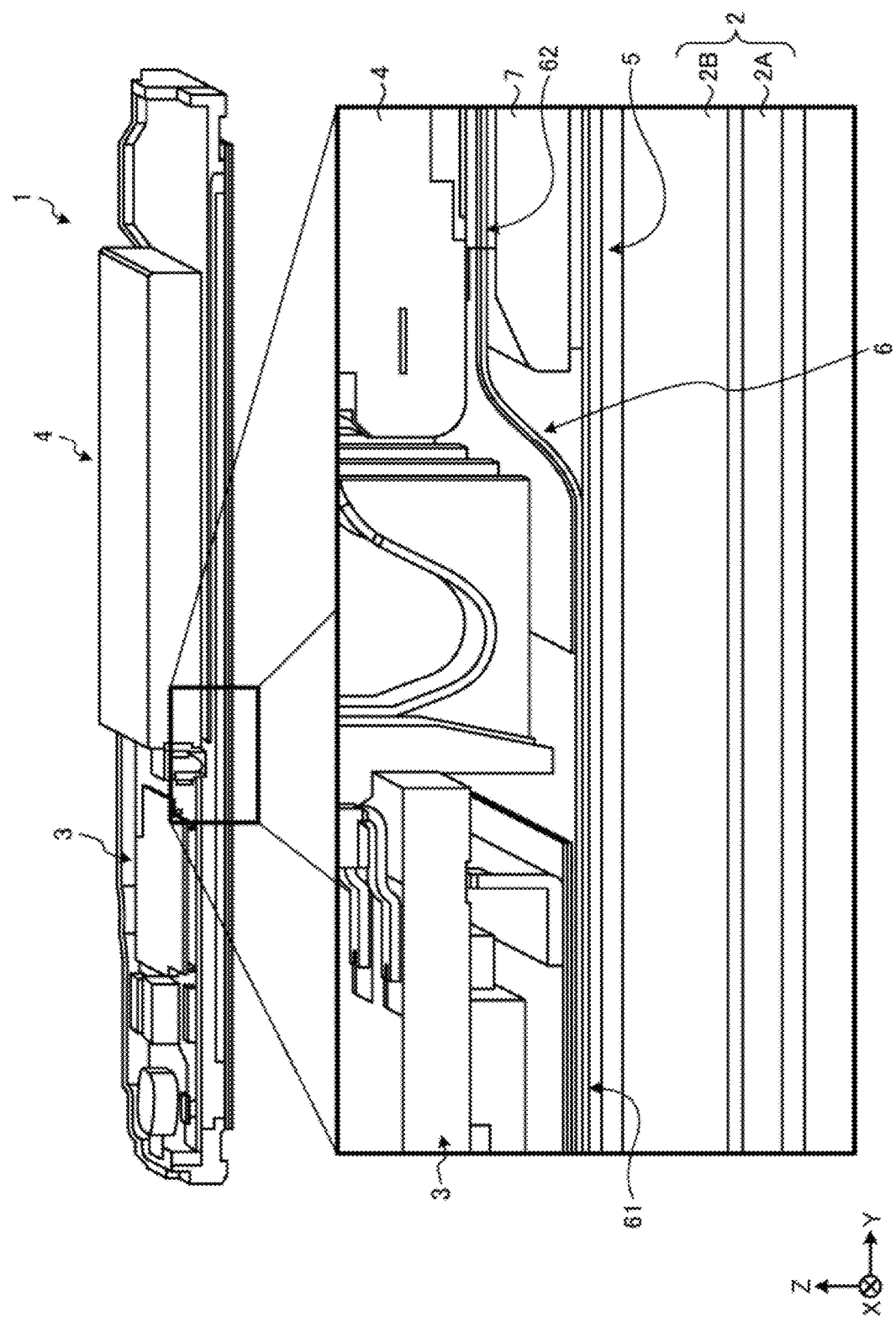
FIG. 3 is a view illustrating a cross-section along a line A-A and an enlarged portion of the electronic device illustrated in FIG. 2.
Figure 4:
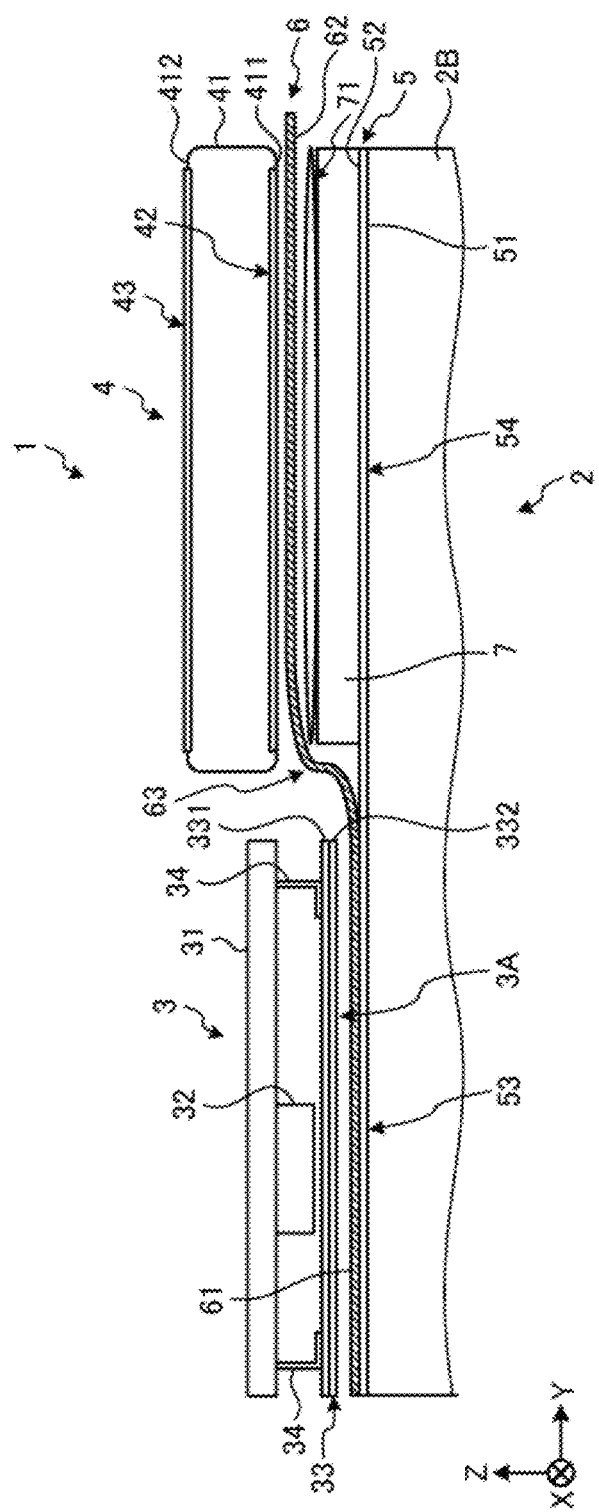
FIG. 4 is a cross-sectional schematic view illustrating a relationship among a heat generating body unit, a battery, and a heat dissipation member of the electronic device illustrated in FIG. 1.
Figure 5:
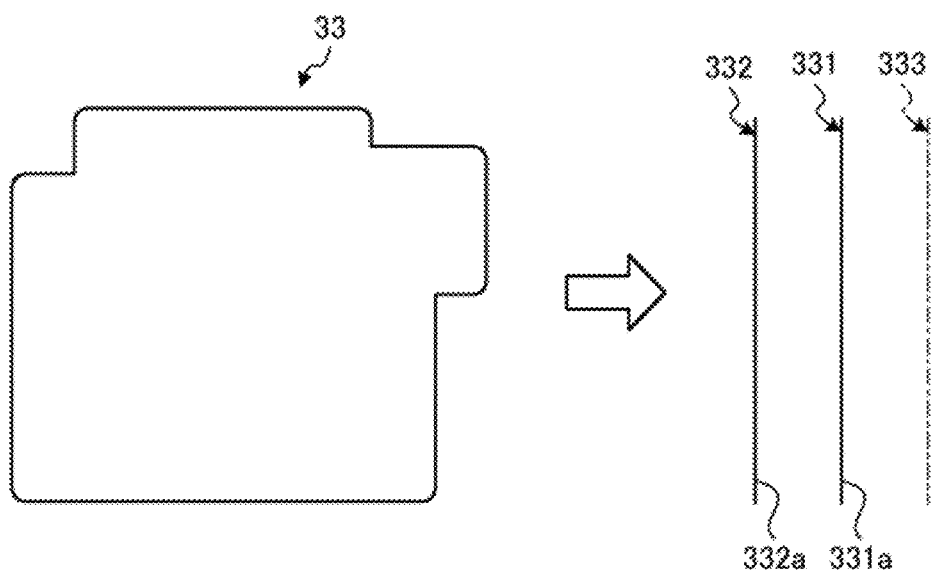
FIG. 5 is a diagram for explaining an example of a configuration of a first heat dissipation member of the heat generating body unit.
Figure 6:
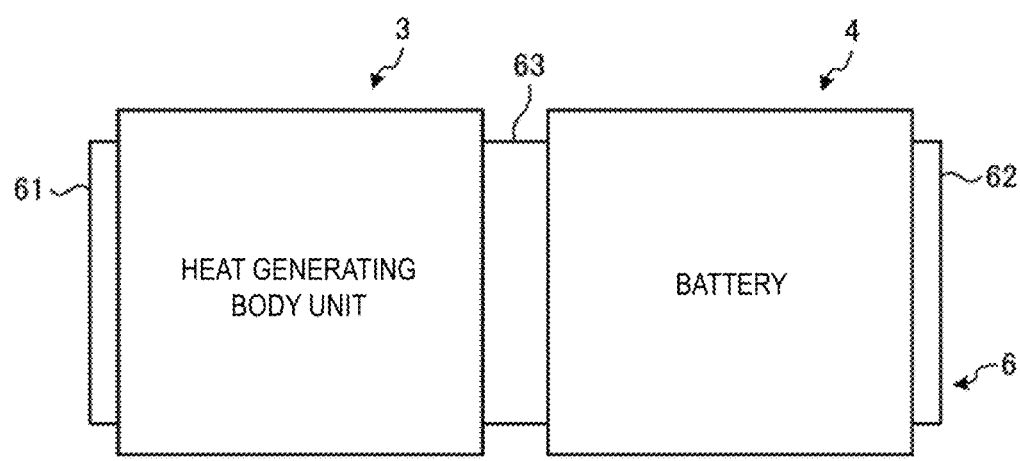
FIG. 6 is a schematic view illustrating an arrangement relationship among the heat generating body unit, the battery, and the heat dissipation member of the electronic device illustrated in FIG. 1.
Figure 6:
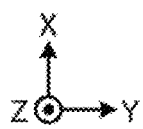

FIG. 1 is an external view of an electronic device according to one of embodiments. FIG. 2 is a diagram illustrating an interior structure of the electronic device illustrated in FIG. 1. FIG. 3 is a view illustrating a cross-section along a line A-A and an enlarged portion of the electronic device illustrated in FIG. 2. FIG. 4 is a cross-sectional schematic view illustrating a relationship among a heat generating body unit, a battery, and a heat dissipation member of the electronic device illustrated in FIG. 1. FIG. 5 is a diagram for explaining an example of a configuration of a first heat dissipation member of the heat generating body unit. FIG. 6 is a schematic view illustrating an arrangement relationship among the heat generating body unit, the battery, and the heat dissipation member of the electronic device illustrated in FIG. 1. In the drawings, an X axis, a Y axis, and a Z axis indicate a width direction, a longitudinal direction, and a thickness direction of an electronic device 1, respectively.

The electronic device 1 illustrated in FIGS. 1 to 3 is, for example, a smartphone. The electronic device 1 may be, for example, a tablet terminal, a notebook personal computer, a portable information terminal, a game console, and a head-mounted display.

As illustrated in FIGS. 1 and 2, the electronic device 1 includes a housing 20. The housing 20 includes a front face 20A. The front face 20A is a front surface of the housing 20. In the electronic device 1, a touch screen display 2 is included on the front face 20A.

The touch screen display 2 has a substantially rectangular shape, but the shape is not limited thereto. As illustrated in FIG. 3, the touch screen display 2 includes a touch screen 2A and a display device 2B. The touch screen 2A and the display device 2B are arranged to overlap with each other, but the arrangement of the touch screen 2A and the display device 2B is not limited thereto. The touch screen 2A and the display device 2B may be arranged side-by-side or may be arranged spaced apart from each other, for example.

The touch screen 2A detects contact of, for example, a finger, a pen, or a stylus, with the touch screen 2A. A detection method of the touch screen 2A may be any method such as a capacitive method, a resistive film method, a surface acoustic wave method (or an ultrasonic method), an infrared method, an electromagnetic inductive method, and a load detection method. The electronic device 1 detects an operation by cooperating with the touch screen display 2.

The display device 2B includes a Liquid Crystal Display (LCD), an Organic Electro-Luminescence Display (OELD), an Inorganic Electro-Luminescence Display (IELD), or the like. The display device 2B displays characters, images, symbols, graphics, and the like.

As illustrated in FIGS. 2 and 3, the electronic device 1 includes a heat generating body unit 3, a battery 4, a third heat dissipation member 5, and a fourth heat dissipation member 6 inside the housing 20. The heat generating body unit 3 is, for example, a unit for radiating heat in a state of being housed inside the housing 20 of the electronic device 1. The heat generating body unit 3 is an example of an information processing unit. The heat generating body unit 3 and the battery 4 are housed inside the housing 20 in a state of being aligned with each other along the longitudinal direction of the electronic device 1. The heat generating body unit 3, the battery 4, the third heat dissipation member 5, and the fourth heat dissipation member 6 are provided on the back surface side of the touch screen display 2. The third heat dissipation member 5 is provided so as to be in contact with the back surface side of the touch screen display 2. A portion 61 of the fourth heat dissipation member 6 is provided inside the housing 20 in a state of being in contact with a portion of the third heat dissipation member 5. An other portion 62 of the fourth heat dissipation member 6 is provided inside the housing 20 in a state of being sandwiched between the battery 4 and an external case 7. The external case 7 is a member constituting the housing location of the battery 4. The heat generating body unit 3 is fixed to the interior of the housing 20 in a state of being in contact with the portion 61 of the fourth heat dissipation member 6. The battery 4 is fixed to the interior of the housing 20 in a state of sandwiching the other portion 62 of the fourth heat dissipation member 6 with the external case 7. The battery 4 may be detachable or non-detachable from the electronic device 1.

As illustrated in FIG. 4, the heat generating body unit 3 includes a substrate 31, a heat generating body 32, a first heat dissipation member 33, and a support part 34. The heat generating body unit 3 includes the first heat dissipation member 33 on a first surface 3A. The first surface 3A includes a surface facing the substrate 31. Note that in FIG. 4, in order to clarify the arrangement relationship between the fourth heat dissipation member 6 and surrounding members thereof, a gap is illustrated in contact (abutting) portions.

The substrate 31 includes a printed circuit board or the like on which the heat generating body 32, an electronic component, and the like are mounted. The substrate 31 includes, for example, a printed circuit board formed into a substantially rectangular plate shape. The substrate 31 includes, for example, a rigid substrate, a flexible substrate, a rigid flexible substrate, and the like. The substrate 31 includes, for example, a substrate half etched on the substrate surface side.

The heat generating body 32 is mounted on the substrate 31. The heat generating body 32 includes, for example, an arithmetic device, an electronic component, and the like performing information processing of the electronic device 1. The heat generating body 32 includes, for example, a Central Processing Unit (CPU), a System-on-a-Chip (SoC), a Micro Control Unit (MCU), and a Field-Programmable Gate Array (FPGA).

The first heat dissipation member 33 includes a member dissipating heat generated by the heat generating body unit 3 to the outside of the heat generating body unit 3. The first heat dissipation member 33 forms the first surface 3A facing the substrate 31. The first heat dissipation member 33 includes an electromagnetic sheet 331 and a graphite sheet 332. The first heat dissipation member 33 is integrally formed of a front side and a back side by the electromagnetic sheet 331 and the graphite sheet 332 being adhered to each other such that the electromagnetic sheet 331 is one surface and the graphite sheet 332 is the other surface.

The electromagnetic sheet 331 is formed of an electrically conductive material capable of shielding electromagnetic waves emitted from an electronic component such as the heat generating body 32 mounted on the substrate 31. Examples of the electrically conductive member include aluminum, alloys thereof, copper, alloys thereof, and stainless steels. The electromagnetic sheet 331 is, for example, a shielding member. The electromagnetic sheet 331 is formed in a sheet shape having a shape to cover the substrate 31 so as to shield electromagnetic waves. The electromagnetic sheet 331 is electrically connected to a ground of the substrate 31.

The graphite sheet 332 is a sheet member obtained by forming graphite, which is an allotrope of carbon, into a sheet shape, a thin plate shape, or the like. The graphite sheet 332 is a member having a high thermal conductivity, and performs heat dissipation of the heat generating body 32 and the like. The graphite sheet 332 is formed such that, for example, the thermal conductivity in the Z-axis direction is higher than the thermal conductivity in the X-axis direction and the Y-axis direction due to a lamination direction of the graphite layers. As a result, the graphite sheet 332 improves diffusibility of heat from the heat generating body 32 in the Z-axis direction. Since, unlike the metal member, the graphite increases in strength as the temperature increases, the first heat dissipation member 33 can increase the strength of the heat generating body unit 3 more than a configuration including only the electromagnetic sheet 331.

Since the heat generating body unit 3 includes the first heat dissipation member 33 integrally formed of the electromagnetic sheet 331 and the graphite sheet 332 as a front side and a back side, the diffusibility of heat radiated from the substrate 31 of the heat generating body 32 or the like can be improved, more than with the configuration including only the electromagnetic sheet 331.

In the present embodiment, as illustrated in the right drawing of FIG. 5, the graphite sheet 332, the electromagnetic sheet 331, and a separator 333 are sequentially laminated on the first heat dissipation member 33 illustrated in the left drawing in FIG. 5. The electromagnetic sheet 331 is adhered to an adhesive surface 332a of the graphite sheet 332 via an adhesive. The separator 333 is adhered to an adhesive surface 331a of the electromagnetic sheet 331 via an adhesive. As a result, by the heat generating body unit 3 including the first heat dissipation member 33, electromagnetic waves can be shielded by the electromagnetic sheet 331 and the diffusibility of heat can be improved by the graphite sheet 332. Note that the first heat dissipation member 33 may be configured to be provided with an insulating sheet or the like between the electromagnetic sheet 331 and the separator 333.

In other words, the heat generating body unit 3 is an information processing unit including the substrate 31, the heat generating body 32 (arithmetic device) mounted on the substrate 31, the electromagnetic sheet 331 covering the heat generating body 32, and the graphite sheet 332 provided on the surface of the electromagnetic sheet 331 opposite to the surface facing the heat generating body 32 to diffuse the heat of the heat generating body 32. On the information processing unit, the electromagnetic sheet 331 and the graphite sheet 332 are integrally formed as a front side and a back side.

Returning to FIG. 4, the support part 34 is provided on the substrate 31 to support the first heat dissipation member 33 so as to form a gap between the first heat dissipation member 33 and the substrate 31. The support part 34 positions and supports the first heat dissipation member 33 at a position where the first heat dissipation member 33 approaches or is in contact with the heat generating body 32. The support section 34 is formed of a metal member or the like, and connects the electromagnetic sheet 331 and the ground of the substrate 31 to each other.

The battery 4 includes a battery body 41, a second heat dissipation member 42, and an exterior member 43. The battery body 41 is a battery component, such as a flat battery pack. For example, a rechargeable battery such as a lithium ion battery can be used as the battery body 41. The second heat dissipation member 42 is provided on a second surface 411 on one side of the battery body 41. The second surface 411 is a surface in contact with the fourth heat dissipation member 6. The battery 4 includes the second heat dissipation member 42 on the second surface 411 on one side of the battery body 41. The second heat dissipation member 42 is formed of a material having a heat transfer property. The material of the second heat dissipation member 42 includes, for example, aluminum and a graphite sheet.

The exterior member 43 is provided on a third surface 412 on the other side of the battery body 41. The third surface 412 on the other side is a surface opposite to the second surface 411. The exterior member 43 is formed of a material having a heat transfer property lower than that of the second heat dissipation member 42 and a strength higher than that of the second heat dissipation member 42. The exterior member 43 is formed of, for example, Steel Use Stainless (SUS). The exterior member 43 may include, for example, a side surface of the battery body 41.

In the present embodiment, in the battery 4, since the exterior of the battery body 41 is formed of the second heat dissipation member 42 and the exterior member 43, the heat transfer property is improved while the rigidity of the battery 4 is ensured. In the battery 4, the ratio between the second heat dissipation member 42 and the exterior member 43 in the exterior can be set as desired according to the strength and the like of the battery 4.

The third heat dissipation member 5 and the fourth heat dissipation member 6 are constituted of the graphite sheet having higher thermal conductivity in the longitudinal direction (Y-axis direction) of the electronic device 1 than in the thickness direction. The third heat dissipation member 5 and the fourth heat dissipation member 6 are formed in a substantially rectangular sheet shape extending along the longitudinal direction (Y-axis direction) of the electronic device 1. The thickness of the third heat dissipation member 5 and the fourth heat dissipation member 6 can be arbitrarily set based on, for example, the amount of heat generated by the heat generating body unit 3, the thickness of the electronic device 1, and the like.

A surface 51 on one side of the third heat dissipation member 5 is provided so as to be in contact with the back surface side of the display device 2B. The back surface side of the display device 2B is a surface side opposite to a display surface of the touch screen display 2. The third heat dissipation member 5 is in contact with the display device 2B functioning as a support body. In a surface 52 on the other side of the third heat dissipation member 5, a portion 53 is in contact with a portion where the fourth heat dissipation member 6 is in contact with the heat generating body unit 3, and the other portion 54 is in contact with the external case 7. The external case 7 is formed in the housing 20 and is a portion of a case for housing the battery 4.

The portion 61 of the fourth heat dissipation member 6 is sandwiched between the first heat dissipation member 33 and the third heat dissipation member 5 in a state of being in contact with the first surface 3A of the heat generating body unit 3 via the first heat dissipation member 33. The heat of the heat generating body 32 and the like is transferred from the first heat dissipation member 33 to the portion 61 of the fourth heat dissipation member 6 by the portion 61 of the fourth heat dissipation member 6 being in contact with the first heat dissipation member 33. The other portion 62 of the fourth heat dissipation member 6 is in contact with the second surface 411 of the battery 4 via the second heat dissipation member. The heat from the portion 61 of the fourth heat dissipation member 6 can be transferred to the second heat dissipation member 42 by the other portion 62 of the fourth heat dissipation member 6 being in contact with the second heat dissipation member 42 of the battery 4. The other portion 62 of the fourth heat dissipation member 6 may be configured to be in contact with a portion of the second surface 411 of the battery 4.

The fourth heat dissipation member 6 includes an intermediate portion 63 between the portion 61 and the other portion 62 of the fourth heat dissipation member 6. The intermediate portion 63 is a portion of the fourth heat dissipation member 6 being not in contact with the first surface 3A of the heat generating body unit 3 nor the second surface 411 of the battery 4. The intermediate portion 63 is a bent portion. By the fourth heat dissipation member 6 being bent, the intermediate portion 63 enables the other portion 62 to be positioned between the second surface 411 of the battery 4 and the external case 7, even when a step is formed inside the housing 20. By providing the intermediate portion 63, the fourth heat dissipation member 6 can have a length in the longitudinal direction of the electronic device 1 that is longer than that of a flat surface and can improve the diffusibility of heat.

The fourth heat dissipation member 6 is sandwiched between the battery 4 and the external case 7 in a state in which the other portion 62 is in contact with the second surface 411 of the battery 4. The other portion 62 of the fourth heat dissipation member 6 is in contact with the external case 7 via a cushioning member 71. The cushioning member 71 is formed of, for example, an elastic member. As a result, the other portion 62 of the fourth heat dissipation member 6 can be improved in adhesiveness by the other portion 62 of the fourth heat dissipation member 6 being brought into contact with the second surface 411 of the battery 4 with the cushioning member 71. As a result, the fourth heat dissipation member 6 can efficiently transfer the heat transferred from the heat generating body unit 3 to the other portion 62 to the second surface 411 of the battery 4.

In an example illustrated in FIG. 6, the fourth heat dissipation member 6 is housed inside the housing 20 across the heat generating body unit 3 and the battery 4 so as to diffuse the heat generated by the heat generating body unit 3 to the entire electronic device 1. The length of the fourth heat dissipation member 6 is formed, for example, so as to be longer than the sum of the length of the heat generating body unit 3 and the length of the battery 4 in the longitudinal direction of the electronic device 1. The fourth heat dissipation member 6 has a length such that the fourth heat dissipation member 6 protrudes from a location in contact with the heat generating body unit 3 to one side of the electronic device 1, and protrudes from a location in contact with the battery 4 to the other side of the electronic device 1, in the longitudinal direction of the electronic device 1. As a result, the electronic device 1 is easily assembled when the fourth heat dissipation member 6 is assembled inside the housing 20 across the heat generating body unit 3 and the battery 4. The length of the third heat dissipation member 5 in the longitudinal direction may be designed based on the fourth heat dissipation member 6, or may be designed based on the size of the display device 2B, and the like.

Returning to FIG. 4, an example of assembly of the electronic device 1 according to the present embodiment will be described. The electronic device 1 is housed in the housing 20 in a state in which the third heat dissipation member 5 is in contact with the display device 2B. The electronic device 1 is assembled such that the third heat dissipation member 5 and the fourth heat dissipation member 6 are layered at a portion of the portion 61 of the fourth heat dissipation member 6 in contact with the first surface 3A of the heat generating body unit 3, and the third heat dissipation member 5 and the external case 7 are in contact with each other at the other portion. In the electronic device 1, the battery 4 is assembled to the housing 20 so that the second surface 411 of the battery 4 sandwiches the external case 7 and the fourth heat dissipation member 6. As a result, in the electronic device 1, the third heat dissipation member 5 and the fourth heat dissipation member 6 are housed in the housing 20 in a state in which the third heat dissipation member 5 and the fourth heat dissipation member 6 are in contact with the heat generating body unit 3 and the fourth heat dissipation member 6 is in contact with the battery 4.

An example of the configuration of the electronic device 1 according to the embodiment is described above. Note that the above-described configurations described using FIGS. 1 to 6 are merely examples, and the configuration of the electronic device 1 according to the present embodiment is not limited to the examples. The functional configuration of the electronic device 1 according to the present embodiment can be flexibly modified according to specifications and operations.

Figure 7:
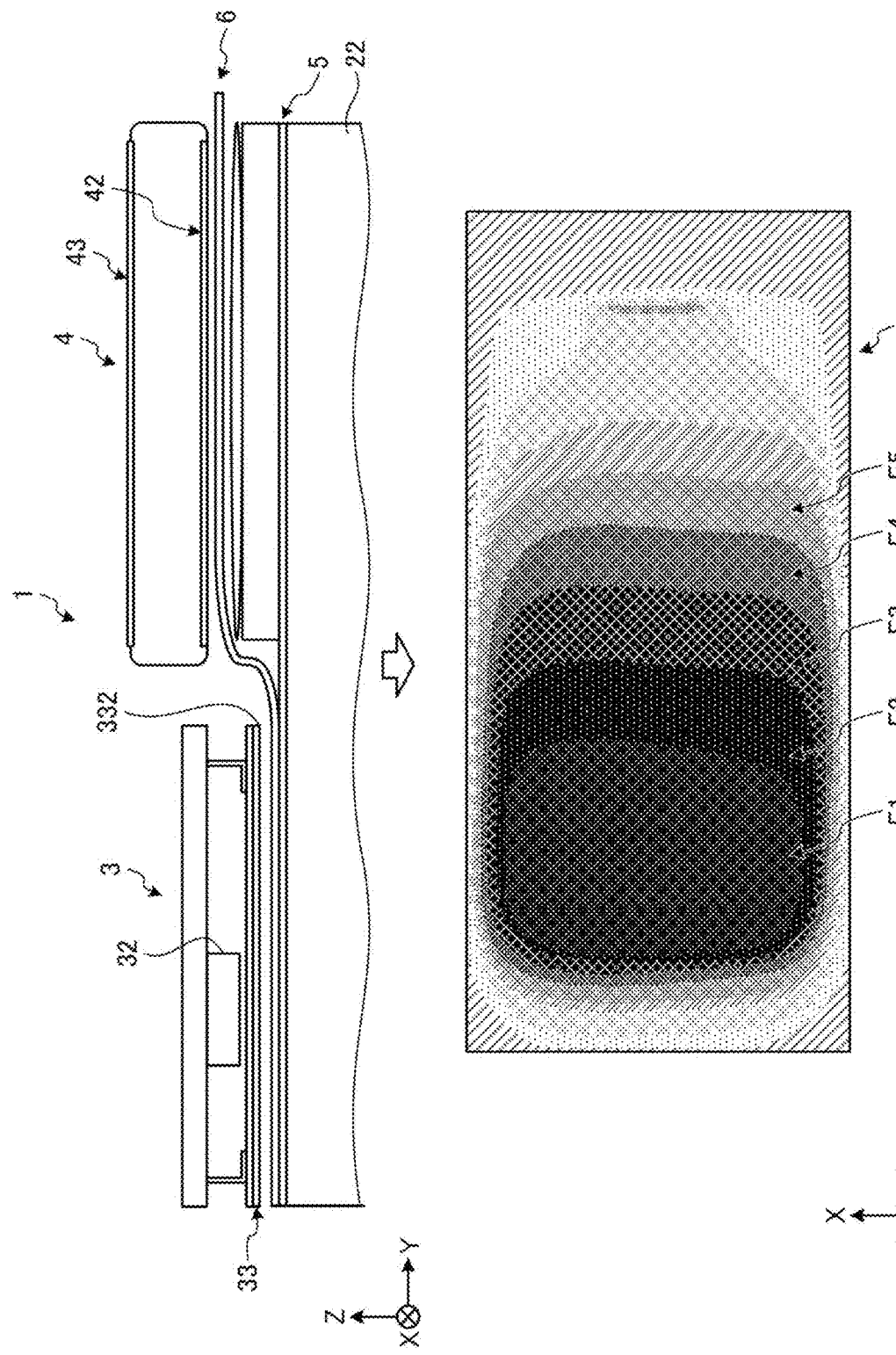
FIG. 7 is a schematic view illustrating an example of heat diffusion in the electronic device according to an embodiment.

FIG. 7 is a schematic view illustrating an example of heat diffusion in the electronic device 1 according to an embodiment. FIG. 7 illustrates a relationship between component positions and heat distribution of the electronic device 1. As illustrated in FIG. 7, in the electronic device 1, when the heat generating body 32 of the heat generating body unit 3 generates heat, a temperature of a region E1 corresponding to the heat generating body 32 is the highest in a heat distribution T. In the electronic device 1, the heat of the heat generating body unit 3 is transferred to the third heat dissipation member 5 and the fourth heat dissipation member 6 via the graphite sheet 332. In the electronic device 1, the third heat dissipation member 5 diffuses the transferred heat in the longitudinal direction. In the electronic device 1, the heat is transferred to the second heat dissipation member 42 on the second surface 411 of the battery 4 by the fourth heat dissipation member 6 diffusing the transferred heat in the longitudinal direction. In other words, in the electronic device 1, the fourth heat dissipation member 6 dissipates the heat of the heat generating body unit 3 to the second heat dissipation member 42 of the battery 4. Furthermore, in the electronic device 1, the third heat dissipation member 5 diffuses the heat of the heat generating body unit 3 to the back side of the display device 2B and below the electronic device 1.

As described above, in the electronic device 1, the temperature of the heat transferred by the third heat dissipation member 5 and the fourth heat dissipation member 6 decreases in the heat distribution T as a distance increases from a region E1 corresponding to the heat generating body 32 to a region E2, a region E3, a region E4, and a region E5. As a result, in the electronic device 1, the diffusibility of heat of the heat generating body unit 3 can be improved not only by providing the graphite sheet 332 in the heat generating body unit 3, but also by further providing the third heat dissipation member 5 and the fourth heat dissipation member 6. In the electronic device 1, the diffusibility of heat from the heat generating body unit 3 to the battery 4 can be further improved by providing the second heat dissipation member 42 on the second surface 411 of the battery 4 with which the fourth heat dissipation member is in contact.

In the electronic device 1, the exterior member 43 having a higher rigidity than that of the second heat dissipation member 42 can be disposed on the third surface 412 facing the second surface 411 of the battery 4. As a result, in the electronic device 1, the diffusibility of heat from the heat generating body unit 3 to the battery 4 can be improved without reducing the strength of the battery 4.

In the electronic device 1, the heat radiated by the heat generating body 3 can be dispersed by the third heat dissipation member 5 and the fourth heat dissipation member 6 by the external case 7 being interposed between the third heat dissipation member 5 and the fourth heat dissipation member 6. As a result, in the electronic device 1, the heat of the heat generating body unit 3 can be diffused in various directions of the housing 20, so that the diffusibility of heat can be further improved.

In the electronic device 1, the fourth heat dissipation member 6 can be improved in adhesiveness by the fourth heat dissipation member 6 being brought into contact with the second surface 411 of the battery 4 by the cushioning member 71 being provided between the third heat dissipation member 5 and the fourth heat dissipation member 6. As a result, in the electronic device 1, the heat transferred from the heat generating body unit 3 to the other portion 62 can be further efficiently transferred to the second surface 411 of the battery 4.

In the electronic device 1, in a case where the heat generating body unit 3 is a box housing the central processing device, since the first heat dissipation member 33 integrally formed of the electromagnetic sheet 331 and the graphite sheet 332 as a front side and a back side is included on the first surface 3A, the electromagnetic waves can be shielded and heat can be dissipated. As a result, in the electronic device 1, since the heat of the heat generating body 3 can be efficiently transferred to the fourth heat dissipation member 6 via the first heat dissipation member 33, the diffusibility of heat can be further improved. Furthermore, in the electronic device 1, an increase in the thickness and weight of the electronic device 1 can be suppressed by the first heat dissipation member 33 integrally formed of the electromagnetic sheet 331 and the graphite sheet 332 as a front side and a back side being included.

In the electronic device 1, since the third heat dissipation member 5 can be brought into contact with the display device 2B, a member supporting the display device 2B need not be provided. As a result, the electronic device 1 can improve the diffusibility of heat of the heat generating body 3 and can contribute to simplification of the interior configuration.

Since the heat generating body unit 3 includes the first heat dissipation member 33 integrally formed of the electromagnetic sheet 331 and the graphite sheet 332 as a front side and a back side on the first surface 3A, the diffusibility of heat of the heat generating body 32 or the like can be improved, more than with a configuration in which the graphite sheet 332 is not used. As a result, in a case where the heat generating body unit 3 is incorporated into the electronic device 1, the heat generating body unit 3 can contribute to improvement of the diffusibility of heat in the electronic device 1.

In the embodiment described above, in the electronic device 1, the case where the other portion 62 of the fourth heat dissipation member 6 is brought into contact with the entire second heat dissipation member 42 of the battery 4 in the longitudinal direction is described, but the embodiment is not limited thereto. For example, the electronic device 1 may be configured such that the other portion 62 of the fourth heat dissipation member 6 is brought into contact with a portion of the second heat dissipation member 42 of the battery 4 in the longitudinal direction.

In the embodiment described above, in the electronic device 1, the case where the third heat dissipation member 5 is in contact with the back side of the display device 2B is described, but the embodiment is not limited thereto. For example, the electronic device 1 may be brought into contact with a support member or the like for supporting the third heat dissipation member 5. The support member includes, for example, a case, a wall, and the like inside the housing 20.

In the embodiment described above, in the electronic device 1, the configuration in which the third heat dissipation member 5 and the fourth heat dissipation member 6 are included is described, but the embodiment is not limited thereto. The electronic device 1 may be configured to include only the fourth heat dissipation member 6 without including the third heat dissipation member 5.

In the embodiment described above, in the electronic device 1, the case where the heat generating body unit 3 and the battery 4 are aligned in the longitudinal direction is described, but the embodiment is not limited thereto. For example, in the electronic device 1, even in a configuration in which the heat generating body 3 and the battery 4 are aligned in the thickness direction, the diffusibility of heat can be improved by the fourth heat dissipation member 6 being brought into contact with the heat generating body unit 3 and the battery 4.

In the embodiment described above, in the electronic device 1, the case where the display device 2B is used as the support body is described, but the embodiment is not limited thereto. For example, the electronic device 1 may be configured such that a plate supporting the display device 2B, a case containing the display device 2B, or the like is used as the support body.

Figure 8:
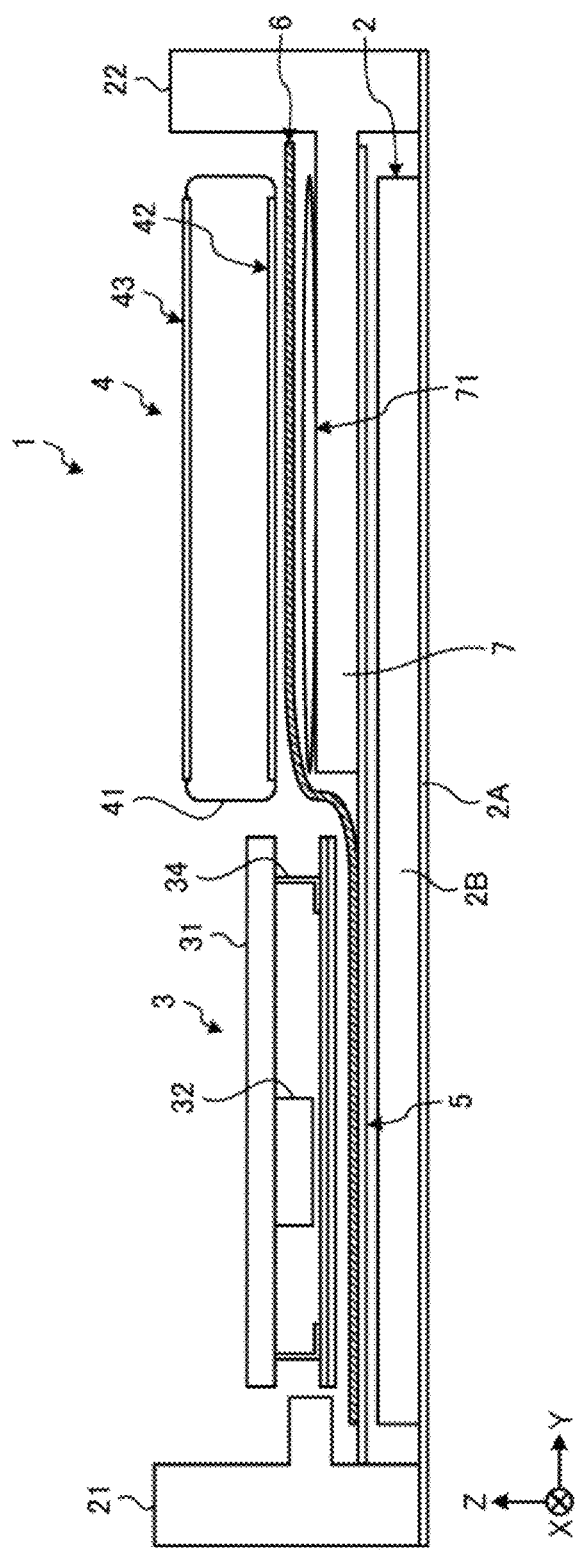
FIG. 8 is a cross-sectional schematic view illustrating an example of a configuration in which a case of the electronic device serves as a support body.
Figure 9:
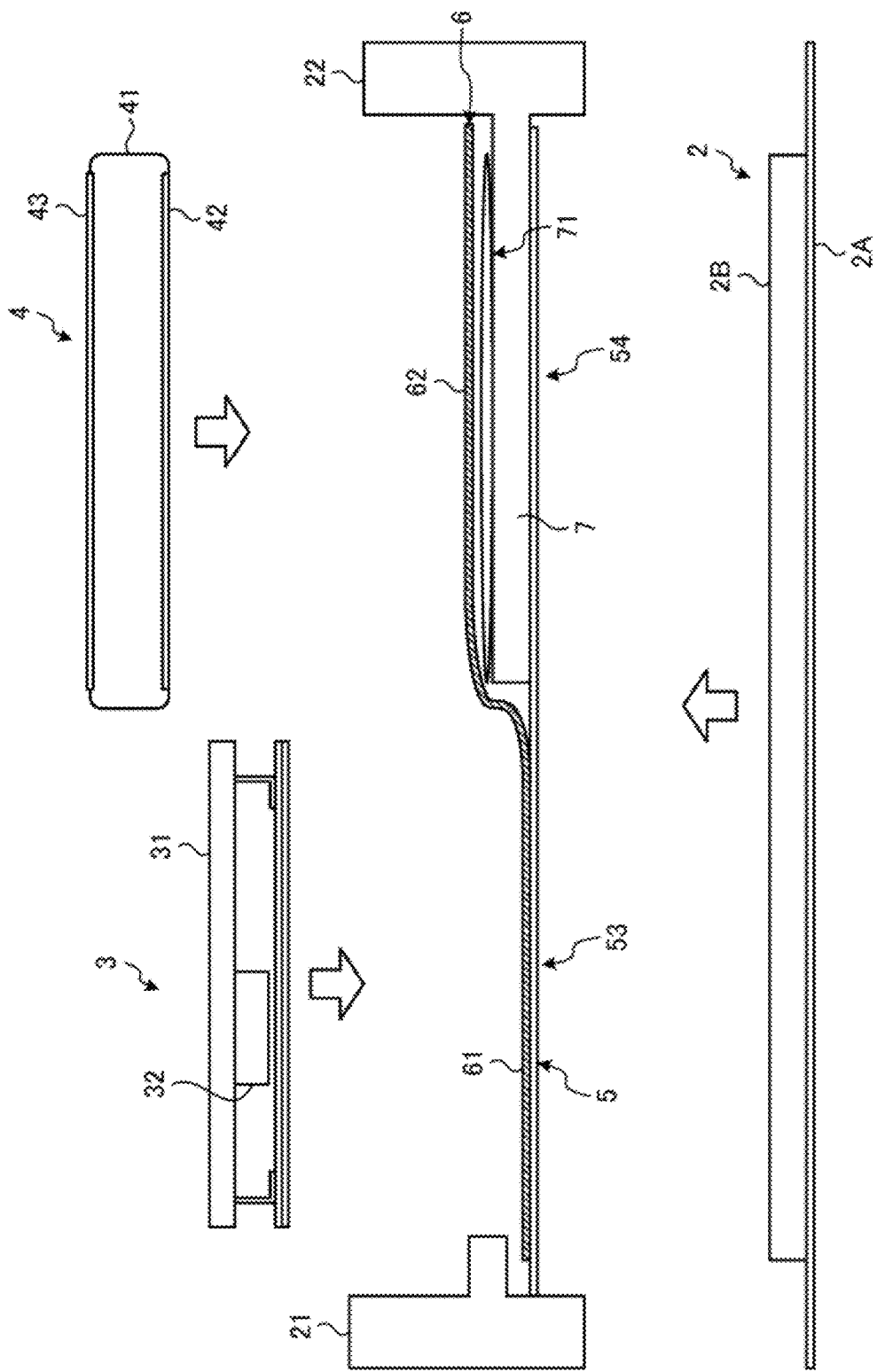
FIG. 9 is an exploded cross-sectional schematic view of the electronic device illustrated in FIG. 8.

FIG. 8 is a cross-sectional schematic view illustrating an example of a configuration in which a case of the electronic device 1 serves as the support body. FIG. 9 is an exploded cross-sectional schematic view of the electronic device 1 illustrated in FIG. 8. In the examples illustrated in FIGS. 8 and 9, in the electronic device 1, a case 21 and a case 22 serve as the support body with which the third heat dissipation member 5 is brought into contact. The case 21 and the case 22 are provided in the housing 20 so as to be interposed between the front face 20A of the electronic device 1 and a back face of the electronic device 1 (the back face is a rear surface of the housing 20). The case 21 and the case 22 are cases for housing the touch screen display 2 and the like. The case 21 and the case 22 are in contact with both ends of the touch screen 2A in the longitudinal direction of the electronic device 1. The portion 53 of the third heat dissipation member 5A is in contact with at least a portion of the case 21. The case 22 is provided with the above-described external case 7. The other portion 54 of the third heat dissipation member 5 is in contact with the case 22 via the external case 7. The third heat dissipation member 5 is assembled in the electronic device 1 in a state of not being in contact with the display device 2B. In the electronic device 1, a gap is provided between the third heat dissipation member 5 and the display device 2B. As described above, the electronic device 1 can be configured such that the third heat dissipation member 5 and the display device 2B are in contact with each other or are not in contact with each other, in consideration of the heat resistance of the display device 2B, the thickness of the device, and the like.

Embodiments have been described in order to fully and clearly disclose the technology according to the appended claims. However, the appended claims are not to be limited to the embodiments described above, and should be configured to embody all modifications and alternative configurations that those skilled in the art may make within the underlying matter set forth herein.

REFERENCE SIGNS LIST

1 Electronic device
2 Touch screen display
2A Touch screen
2B Display device
3 Heat generating body unit
3A First surface
4 Battery
5 Third heat dissipation member
6 Fourth heat dissipation member
7 External case
21, 22 Case
31 Substrate
32 Heat generating body
33 First heat dissipation member
34 Support part
41 Battery body
42 Second heat dissipation member
43 External member
331 Electromagnetic sheet
332 Graphite sheet
411 Second surface
412 Third surface

The invention claimed is:

1. An electronic device comprising:
a heat generating body unit comprising a first heat dissipation member on a first surface;
a battery comprising a second heat dissipation member on a second surface;
a third heat dissipation member in contact with a support body; and
a fourth heat dissipation member,
wherein the fourth heat dissipation member is sandwiched between the first heat dissipation member and the third heat dissipation member in a state in which at least a portion of the fourth heat dissipation member is in contact with the first surface via the first heat dissipation member, and an other portion of the fourth heat dissipation member is in contact with the second surface via the second heat dissipation member.

2. The electronic device according to claim 1,
wherein the battery comprises a member having a higher rigidity than that of the second heat dissipation member on a surface opposite to the second surface.

3. The electronic device according to claim 1,
wherein at least one member is provided between the third heat dissipation member and the fourth heat dissipation member.

4. The electronic device according to claim 3,
wherein the at least one member comprises a cushioning member.

5. The electronic device according to claim 1,
wherein the heat generating body unit is a box configured to house a central processing device, and
the first heat dissipation member is integrally formed of a graphite sheet and an electromagnetic sheet as a front side and a back side, and comprises the graphite sheet on the first surface.

6. The electronic device according to claim 1, the electronic device further comprising:
the support body serving as a display device.

7. An electronic device, comprising:
- a heat generating body unit comprising a first heat dissipation member on a first surface;
- a battery comprising a second heat dissipation member on a second surface;
- a third heat dissipation member; and
- a fourth heat dissipation member,
- wherein the fourth heat dissipation member is sandwiched between the first heat dissipation member and the third heat dissipation member in a state in which at least a portion of the fourth heat dissipation member is in contact with the first surface via the first heat dissipation member, and an other portion of the fourth heat dissipation member is in contact with the second surface via the second heat dissipation member.

* * * * *